(12) United States Patent
Ikeda et al.

(10) Patent No.: US 11,626,450 B2
(45) Date of Patent: Apr. 11, 2023

(54) DISPLAY APPARATUS WITH IMPROVED RESISTANCE AGAINST ELECTROMAGNETIC NOISE

(71) Applicant: Japan Display Inc., Tokyo (JP)

(72) Inventors: Masanobu Ikeda, Tokyo (JP); Yasuhiro Kanaya, Tokyo (JP)

(73) Assignee: Japan Display Inc., Tokyo (JP)

( * ) Notice: Subject to any disclaimer, the term of this patent is extended or adjusted under 35 U.S.C. 154(b) by 199 days.

(21) Appl. No.: 17/104,842

(22) Filed: Nov. 25, 2020

(65) Prior Publication Data

US 2021/0082996 A1    Mar. 18, 2021

Related U.S. Application Data

(63) Continuation of application No. PCT/JP2019/017103, filed on Apr. 22, 2019.

(30) Foreign Application Priority Data

May 31, 2018   (JP) .............................. JP2018-105440

(51) Int. Cl.
    *H01L 27/15*    (2006.01)
    *H01L 33/48*    (2010.01)
    (Continued)

(52) U.S. Cl.
    CPC .......... *H01L 27/156* (2013.01); *H01L 33/486* (2013.01); *H01L 33/58* (2013.01); *H01L 33/62* (2013.01)

(58) Field of Classification Search
    CPC ....... H01L 33/486; H01L 33/58; H01L 33/62; H01L 27/156
    See application file for complete search history.

(56) References Cited

U.S. PATENT DOCUMENTS

2014/0267683 A1    9/2014   Bibi et al.
2017/0213502 A1    7/2017   Henry et al.
(Continued)

FOREIGN PATENT DOCUMENTS

JP    2016512347 A    4/2016
JP    2017529557 A   10/2017
(Continued)

OTHER PUBLICATIONS

Chinese Office Action dated Nov. 29, 2021 in corresponding Chinese Application No. 201980035397.9.
(Continued)

*Primary Examiner* — Suberr L Chi
(74) *Attorney, Agent, or Firm* — K&L Gates LLP

(57) ABSTRACT

According to an aspect, a display apparatus includes: a substrate; a plurality of pixels disposed on the substrate; a plurality of inorganic light emitting elements that are provided in the pixels, respectively; an electrode that is translucent and provided on one surface side of the substrate and that is coupled to one of the inorganic light emitting elements; a first conductive layer that is translucent and provided on the one surface side of the substrate and that covers the electrode; and a cover member that is translucent and provided on the one surface side of the substrate and that covers the first conductive layer. A sheet resistance value of the first conductive layer is higher than a sheet resistance value of the electrode.

9 Claims, 16 Drawing Sheets

(51) Int. Cl.
*H01L 33/58* (2010.01)
*H01L 33/62* (2010.01)

(56) References Cited

U.S. PATENT DOCUMENTS

| | | |
|---|---|---|
| 2017/0301724 A1 | 10/2017 | Lee |
| 2018/0122298 A1 | 5/2018 | Lee et al. |
| 2018/0122836 A1 | 5/2018 | Kang et al. |
| 2018/0358339 A1 | 12/2018 | Iguchi |
| 2019/0379002 A1* | 12/2019 | Abe ................. H01L 51/5012 |

FOREIGN PATENT DOCUMENTS

| | | |
|---|---|---|
| JP | 2018078279 A | 5/2018 |
| WO | 2017094461 A1 | 6/2017 |

OTHER PUBLICATIONS

International Search Report issued in Application No. PCT/JP2019/017103, dated Jun. 18, 2019.

* cited by examiner

DISPLAY APPARATUS WITH IMPROVED RESISTANCE AGAINST ELECTROMAGNETIC NOISE

CROSS-REFERENCE TO RELATED APPLICATION

This application claims the benefit of priority from Japanese Patent Application No. 2018-105440 filed on May 31, 2018 and International Patent Application No. PCT/JP2019/017103 filed on Apr. 22, 2019, the entire contents of which are incorporated herein by reference.

BACKGROUND

1. Technical Field

The present disclosure relates to a display apparatus.

2. Description of the Related Art

In recent years, an inorganic electroluminescence (EL) display using an inorganic light emitting diode (micro LED) as a display element has been attracting attention (for example, see Japanese Translation of PCT International Application Publication No. JP-T-2017-529557). In the inorganic EL display, a plurality of light emitting elements that emit light in different colors are disposed on an array substrate. By using a self-light emitting element, the inorganic EL display does not require a light source. The inorganic EL display also has a high utilization efficiency of light, because the light is emitted without passing through a color filter. The inorganic EL display also has an excellent environmental resistance compared to an organic EL display that uses an organic light emitting diode (OLED) as a display element.

The inorganic light emitting diode in the inorganic EL display may be damaged by electromagnetic noise such as static electricity, and the diode may not turn ON.

SUMMARY

According to an aspect, a display apparatus includes: a substrate; a plurality of pixels disposed on the substrate; a plurality of inorganic light emitting elements that are provided in the pixels, respectively; an electrode that is translucent and provided on one surface side of the substrate and that is coupled to the inorganic light emitting element; a first conductive layer that is translucent and provided on the one surface side of the substrate and that covers the electrode; and a cover member that is translucent and provided on the one surface side of the substrate and that covers the first conductive layer. A sheet resistance value of the first conductive layer is higher than a sheet resistance value of the electrode.

DETAILED DESCRIPTION

Figure 1:
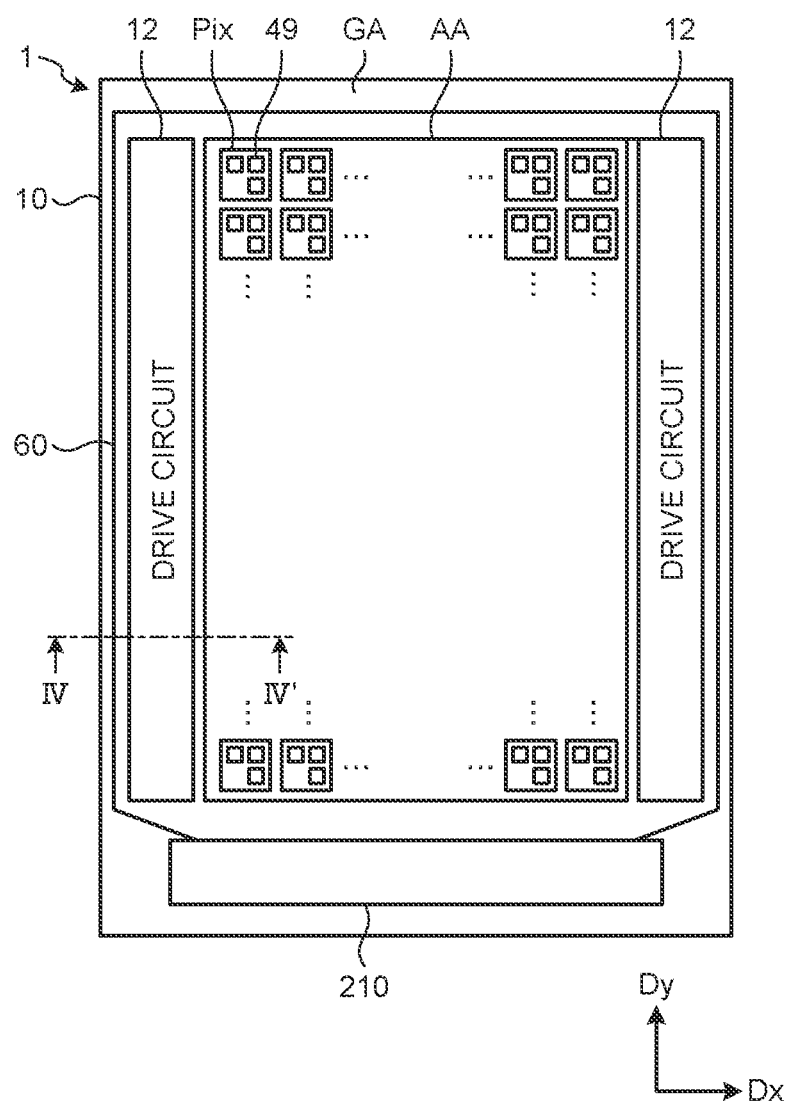
FIG. 1 is a plan view illustrating a configuration example of a display apparatus according to a first embodiment.

Hereinafter, embodiments of the present disclosure will be described in detail with reference to the accompanying drawings. What is disclosed herein is merely an example, and the present disclosure naturally encompasses an appropriate modification maintaining the gist of the disclosure that is easily conceivable by those skilled in the art. To further clarify the description, a width, a thickness, a shape, and the like of each component may be schematically illustrated in the drawings as compared with an actual aspect. However, this is merely an example, and interpretation of the present disclosure is not limited thereto. The same element as that described in the drawing that has already been discussed is denoted by the same reference numeral throughout the present specification and the drawings, and the detailed description thereof may be omitted as appropriate.

First Embodiment

FIG. 1 is a plan view illustrating a configuration example of a display apparatus according to a first embodiment. As illustrated in FIG. 1, a display apparatus 1 includes a substrate 10, a pixel Pix, a drive circuit 12, a drive integrated circuit (IC) 210, and cathode wiring 60.

As illustrated in FIG. 1, the display apparatus 1 includes a display region AA and a peripheral region GA. The display region AA is a region where a plurality of the pixels Pix are arranged, and is a region for displaying an image. The peripheral region GA is a region that does not overlap with the pixels Pix, and is located outside the display region AA.

The pixels Pix are disposed in the display region AA in a first direction Dx and a second direction Dy. The first direction Dx and the second direction Dy are directions parallel to one surface 10a of the substrate 10 (see FIG. 4). The first direction Dx is orthogonal to the second direction Dy. However, the first direction Dx may intersect with the second direction Dy in a non-orthogonal manner. A third direction Dz is a direction orthogonal to the first direction Dx and the second direction Dy. For example, the third direction Dz corresponds to the normal direction of the substrate 10. Hereinafter, a plan view illustrates a positional relation viewed from the third direction Dz.

The drive circuit 12 is a circuit that drives a plurality of gate lines (first gate line GCL1 and second gate line GCL2 (see FIG. 3)) on the basis of various control signals from the drive IC 210. The drive circuit 12 sequentially or simultaneously selects the gate lines and supplies a gate drive signal to the selected gate lines. Thus, the drive circuit 12 selects the pixels Pix coupled to the gate lines.

The drive IC 210 is a circuit for controlling the display of the display apparatus 1. The drive IC 210 may be mounted on the peripheral region GA of the substrate 10 as a chip on glass (COG). However, the drive IC 210 is not limited thereto and may also be mounted on a flexible print substrate or a rigid substrate coupled to the peripheral region GA of the substrate 10 as a chip on film (COF).

The cathode wiring 60 is provided in the peripheral region GA of the substrate 10. The cathode wiring 60 surrounds the pixels Pix in the display region AA and the drive circuit 12 in the peripheral region GA. Cathodes of a plurality of inorganic light emitting elements 100 (see FIG. 4) are coupled to the common cathode wiring 60 and supplied with a ground potential. More specifically, a cathode terminal 55p (second terminal) of each of the inorganic light emitting elements 100 is coupled to the cathode wiring 60 via a cathode electrode 55e (second electrode) on a thin film transistor (TFT) substrate side.

Figure 2:
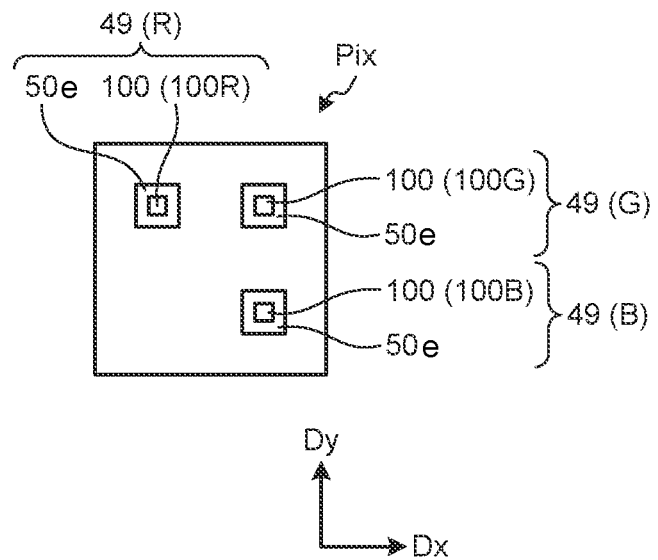
FIG. 2 is a plan view illustrating a configuration example of a pixel according to the first embodiment.

FIG. 2 is a plan view illustrating a configuration example of a pixel according to the first embodiment. As illustrated in FIG. 2, a single pixel Pix includes a plurality of pixels 49. For example, the pixel Pix includes a first pixel 49R, a second pixel 49G, and a third pixel 49B. The first pixel 49R displays red, which is a primary color, as a first color. The second pixel 49G displays green, which is a primary color, as a second color. The third pixel 49B displays blue, which is a primary color, as a third color. As illustrated in FIG. 2, in a single Pixel Pix, the first pixel 49R and the third pixel 49B are aligned in the first direction Dx. The second pixel 49G and the third pixel 49B are aligned in the second direction Dy. The first color, the second color, and the third color are not limited to red, green, and blue, and may be any color such as a complementary color. In the following, if the first pixel 49R, the second pixel 49G, and the third pixel 49B need not be distinguished from each other, the first pixel 49R, the second pixel 49G, and the third pixel 49B are simply referred to as a pixel 49.

Each pixel 49 includes the inorganic light emitting element 100. The display apparatus 1 displays an image when each of the inorganic light emitting elements 100 in the first pixel 49R, the second pixel 49G, and the third pixel 49B emits different light. In a plan view, the inorganic light emitting element 100 is an inorganic light emitting diode (LED) chip having the size of about 3 μm to 300 μm. The inorganic light emitting element 100 is referred to as a micro LED. The display apparatus that has a micro LED in each pixel may also be referred to as a micro LED display apparatus. The term "micro" in the micro LED does not limit the size of the inorganic light emitting element 100.

Figure 3:
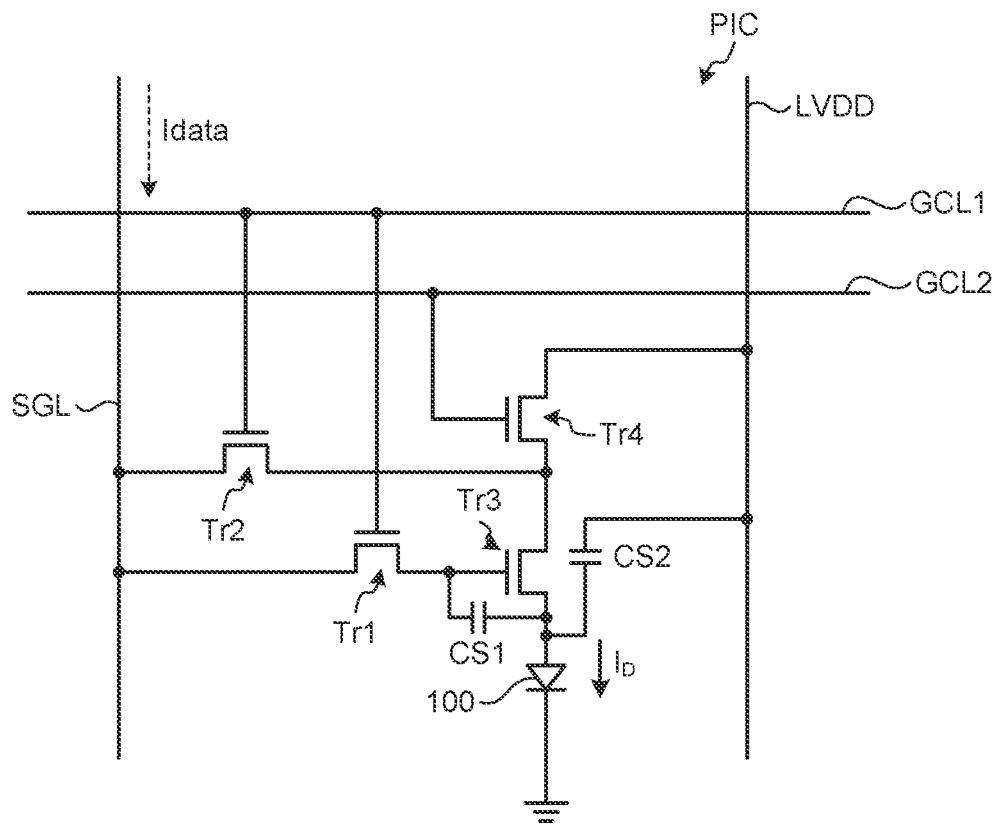
FIG. 3 is a circuit diagram illustrating a configuration example of a pixel circuit according to the first embodiment.

FIG. 3 is a circuit diagram illustrating a configuration example of a pixel circuit according to the first embodiment. As illustrated in FIG. 3, the pixel 49 includes a pixel circuit PIC for driving the pixel 49. For example, the pixel circuit PIC includes a switching transistor Tr1, a current switching transistors Tr2 and Tr4, a drive transistor Tr3, and the inorganic light emitting element 100. The transistors Tr1 to Tr4, and a transistor Try (see FIG. 4), which will be described later, are thin film transistors (TFTs).

The gate of the transistor Tr1 is coupled to the first gate line GCL1, the source thereof is coupled to a signal line SGL, and the drain thereof is coupled to the gate of the transistor Tr3. The gate of the transistor Tr2 is coupled to the first gate line GCL1, the source thereof is coupled to the signal line SGL, and the drain thereof is coupled to the source of the transistor Tr3 and the drain of the transistor Tr4. The gate of the transistor Tr3 is coupled to the drain of the transistor Tr1, the source thereof is coupled to the drains of the transistors Tr2 and Tr4, and the drain thereof is coupled to an anode of the inorganic light emitting element 100. The gate of the transistor Tr4 is coupled to the second gate line GCL2, the source thereof is coupled to a power supply line LVDD, and the drain thereof is coupled to the drain of the transistor Tr2 and the source of the transistor Tr3.

An end of a first capacitor CS1 is coupled to the drain of the transistor Tr1 and the gate of the transistor Tr3, and the other end thereof is coupled to the drain of the transistor Tr3 and the anode of the inorganic light emitting element 100. An end of a second capacitor CS2 is coupled to the power supply line LVDD, and the other end thereof is coupled to the anode of the inorganic light emitting element 100. The first capacitor CS1 and the second capacitor CS2 are added to the pixel 49, to suppress the fluctuation of the gate voltage caused by the parasitic capacitance and leak current of the transistor Tr1. The cathode terminal 55p of the inorganic light emitting element 100 is coupled to a fixed potential via the cathode wiring 60. For example, the fixed potential is a ground potential.

The power supply line LVDD is coupled to a constant voltage source. The power supply line LVDD supplies a direct current constant voltage Vdd to the source of the transistor Tr4 and an end of the second capacitor CS2. The signal line SGL is coupled to a constant current source. The signal line SGL supplies a direct constant current Idata to each source of the transistors Tr1 and Tr2. The first gate line GCL1 and the second gate line GCL2 are coupled to the drive circuit 12 (see FIG. 1).

When the display apparatus 1 sets the potential of the first gate line GCL1 to a high level and sets the potential of the second gate line GCL2 to a low level, the transistors Tr1 and Tr2 are turned ON, and the transistor Tr4 is turned OFF. Thus, the constant current Idata is supplied to the inorganic light emitting element 100 from the signal line SGL. When the display apparatus 1 sets the potential of the first gate line GCL1 to a low level and sets the potential of the second gate line GCL2 to a high level, the transistors Tr1 and Tr2 are turned OFF, and the transistor Tr4 is turned ON. Thus, the constant voltage Vdd is supplied to the inorganic light emitting element 100 from the power supply line LVDD.

Figure 4:
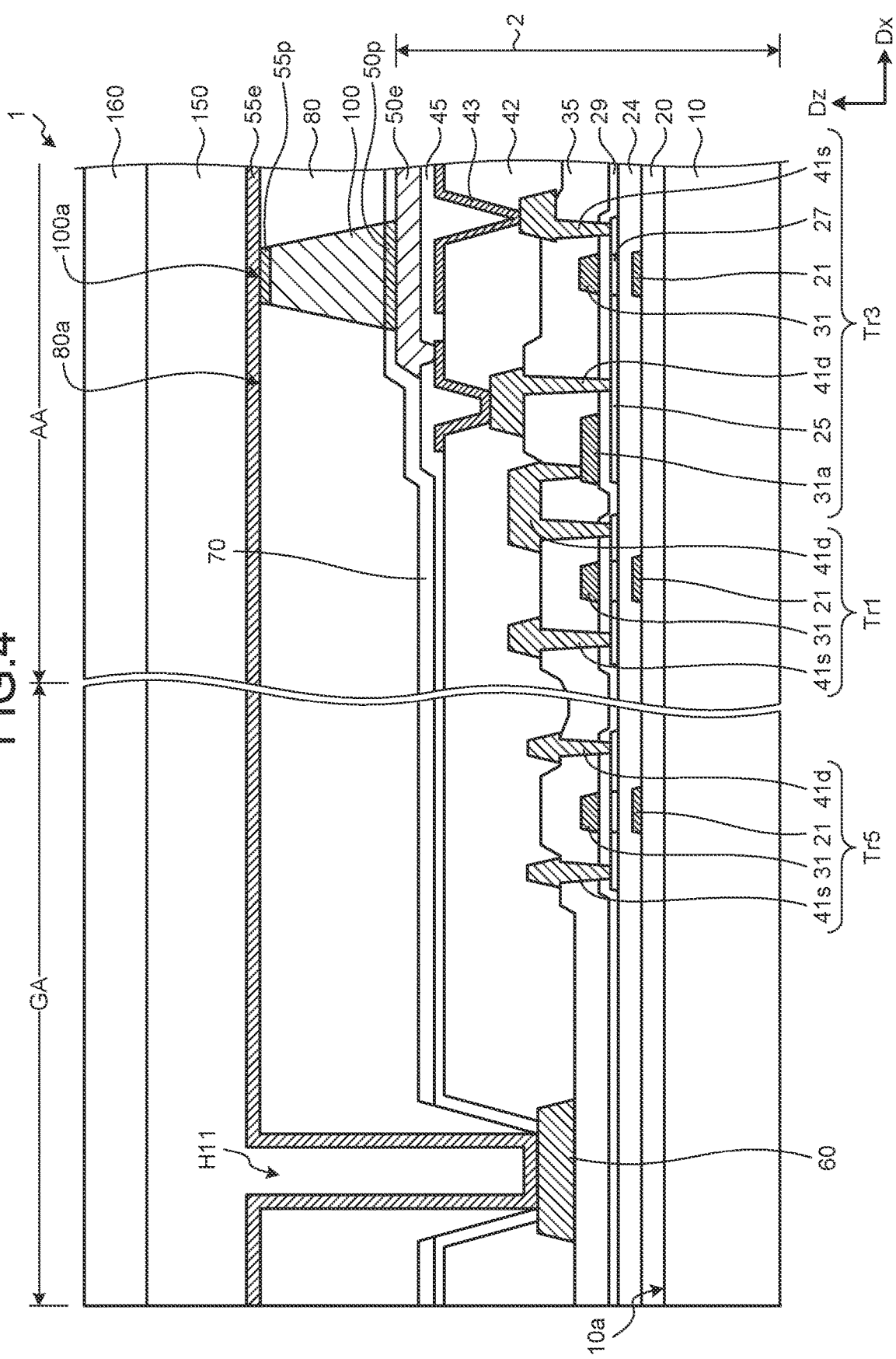
FIG. 4 is a sectional view illustrating a configuration example of the display apparatus according to the first embodiment.
Figure 5:
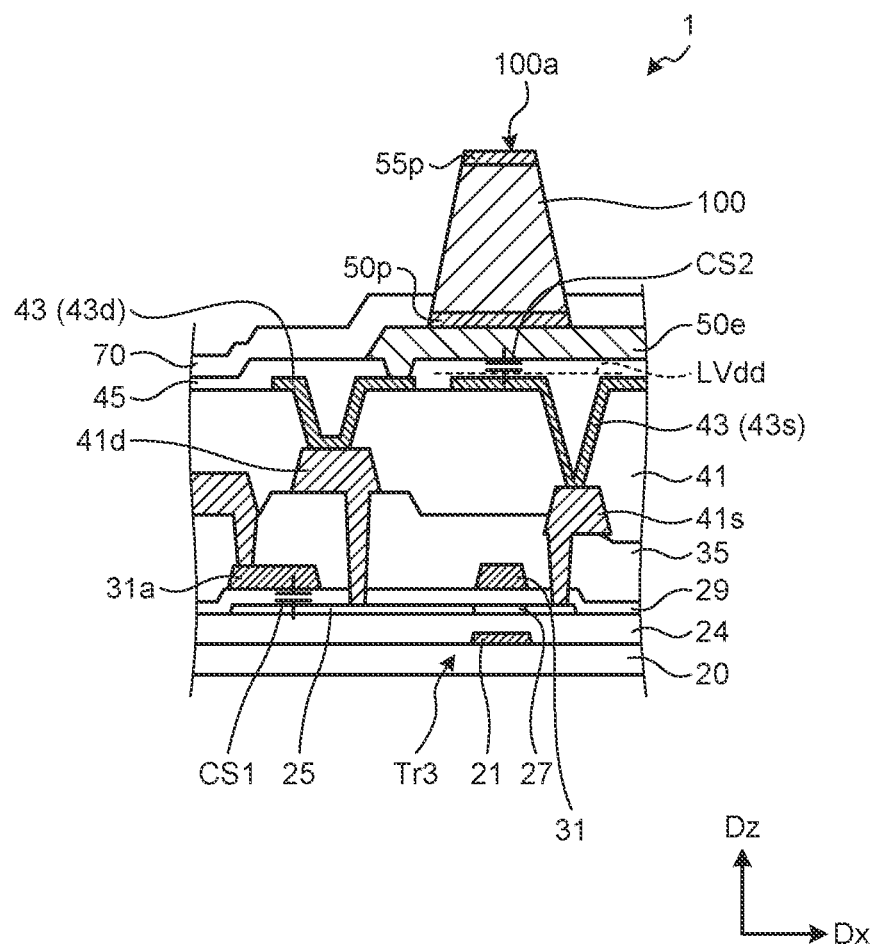
FIG. 5 is an enlarged sectional view of an inorganic light emitting element and a transistor coupled to the inorganic light emitting element, in the display apparatus according to the first embodiment.

FIG. 4 is a sectional view illustrating a configuration example of the display apparatus according to the first embodiment. FIG. 4 is a cross-section of the plan view illustrated in FIG. 1, cut along a line IV-IV'. FIG. 5 is an enlarged sectional view of an inorganic light emitting element and a transistor coupled to the inorganic light emitting element, in the display apparatus according to the first embodiment. As illustrated in FIG. 4 and FIG. 5, the display apparatus 1 includes the substrate 10, an undercoat layer 20 provided on the one surface 10a of the substrate 10, and a plurality of the transistors provided on the undercoat layer 20. For example, the transistors Tr1, Tr2, Tr3, and Tr4 included in the pixel 49 are provided in the display region AA of the substrate 10, as the transistors. The transistor Tr5 included in the drive circuit 12 is provided in the peripheral region GA of the substrate 10, as the transistors.

For example, the substrate 10 is a glass substrate, a quartz substrate, or a flexible substrate made of acrylic resin, polyimide resin, polyethylene terephthalate resin (PET resin), polyethylene naphthalate resin (PEN resin), cycloolefin polymer resin (COP resin) resin, or epoxy resin. For example, the transistors Tr1 to Tr5 are TFTs each having a double gate structure. The transistors Tr1 to Tr5 each include a first gate electrode 21 provided on the undercoat layer 20, an insulation film 24 that is provided on the undercoat layer 20 and that covers the first gate electrode 21, a semiconductor layer 25 provided on the insulation film 24, an insulation film 29 provided on the semiconductor layer 25, and a second gate electrode 31 provided on the insulation film 29. The insulation films 24 and 29 are inorganic insulation films. The first gate electrode 21 and the second gate electrode 31 face each other in the third direction Dz with the insulation film 24, the semiconductor layer 25, and the insulation film 29 interposed therebetween. In the insulation films 24 and 29, a portion interposed between the first gate electrode 21 and the second gate electrode 31 functions as a gate insulation film. In the semiconductor layer 25, a portion interposed between the first gate electrode 21 and the second gate electrode 31 is a channel 27 of the TFT. In the semiconductor layer 25, a portion coupled to a source electrode 41s, which will be described below, is the source of the TFT, and a portion coupled to a drain electrode 41d, which will be described later, is the drain of the TFT.

In the first embodiment, the structure of the transistors Tr1 to Tr5 is not limited to the double gate structure. The transistors Tr1 to Tr5 may also be of a bottom gate type in which the gate electrode is formed only of the first gate electrode 21. The transistors Tr1 to Tr5 may also be a top gate type in which the gate electrode is formed only of the second gate electrode 31. The undercoat layer 20 is not necessarily required.

The display apparatus 1 includes an insulation film 35 that is provided on the one surface of the substrate 10 and that covers the transistors Tr1 to Tr5, the source electrode 41s that penetrates through the insulation film 35 and that is coupled to the sources of the transistors Tr1 to Tr5, and the drain electrode 41d that penetrates through the insulation film 35 and that is coupled to the drains of the transistors Tr1 to Tr5. The display apparatus 1 also includes the cathode wiring 60 provided on the insulation film 35, and an insulation film 42 that covers the source electrode 41s, the drain electrode 41d, and the cathode wiring 60. The insulation film 35 is an inorganic insulation film, and the insulation film 42 is an organic insulation film.

The display apparatus 1 further includes source connection wiring 43s that penetrates through the insulation film 42 and that is coupled to the source electrode 41s, drain connection wiring 43d that penetrates through the insulation film 42 and that is coupled to the drain electrode 41d, and an insulation film 45 that is provided on the insulation film 42 and that covers the source connection wiring 43s and the drain connection wiring 43d. The display apparatus 1 still further includes an anode electrode 50e (first electrode) provided on the insulation film 45. The anode electrode 50e penetrates through the insulation film 45 and is coupled to the drain connection wiring 43d of the transistor Tr3.

The display apparatus 1 still further includes an insulation film 70 that is provided on the insulation film 45 and that covers the side surface of the anode electrode 50e, an insulating planarization layer 80 that is provided on the insulation film 70 and that covers the side surface of the inorganic light emitting element 100, and the cathode electrode 55e (second electrode) provided on the planarization layer 80. The insulation film 70 is an inorganic insulation film. The planarization layer 80 is a translucent organic insulation film or an organic/inorganic hybrid insulation film (for example, a material in which an organic group (methyl group or phenyl group) is bonded to the main chain of silicon and oxygen (Si—O)).

The upper surface of the inorganic light emitting element 100 is exposed from the planarization layer 80. The cathode electrode 55e is coupled to the upper surface (cathode terminal 55p) of the inorganic light emitting element 100 exposed from the planarization layer 80. In the peripheral region GA, a contact hole H11 the bottom surface of which is the cathode wiring 60, is provided in the planarization layer 80 and the insulation films 70, 45, and 42. The cathode electrode 55e passes through the inside surface of the contact hole H11 from the upper surface of the planarization layer 80 and is coupled to the cathode wiring 60.

The display apparatus 1 still further includes a translucent adhesion layer 150 that is provided on the planarization layer 80 and that covers the cathode electrode 55e, and a cover member 160 provided on the adhesion layer 150. The adhesion layer 150 is arranged on the one surface 10a side of the substrate 10 including the inside of the contact hole H11 and flattens the one surface 10a side of the substrate 10. The adhesion layer 150 is conductive resin. For example, the adhesion layer 150 is optical clear resin (OCR) or optical clear adhesive (OCA). The sheet resistance value of the adhesion layer 150 is higher than the sheet resistance value of the cathode electrode 55e. For example, the sheet resistance value of the adhesion layer 150 is higher than the sheet resistance value of the cathode electrode 55e by two or more orders of magnitude. The sheet resistance value of the adhesion layer 150 is greater than 10 kΩ/sq and equal to or less than $10^{12}$ Ω/sq. The adhesion layer 150 is coupled to the cathode wiring 60 at the bottom portion of the contact hole H11 via the cathode electrode 55e. The cathode wiring 60 is coupled to the ground potential.

The cover member 160 is a light transmissive substrate such as a glass substrate or a resin substrate. When the cover member 160 is a glass substrate, the cover member 160 is also referred to as cover glass.

In the display apparatus 1, an array substrate 2 includes the layers from the substrate 10 to the anode electrode 50e. The array substrate 2 does not include the insulation film 70, the planarization layer 80, a cathode electrode 55e, the inorganic light emitting element 100, the adhesion layer 150, and the cover member 160. The array substrate 2 is a drive circuit substrate that drives the pixels Pix and is also referred to as a backplane or an active matrix substrate.

The materials of the layers formed on the one surface 10a side of the substrate 10 will now be described. For example, the first gate electrode 21, the second gate electrode 31, the source electrode 41s, the drain electrode 41d, the source connection wiring 43s, the drain connection wiring 43d, the anode electrode 50e, the cathode electrode 55e, and the cathode wiring 60 are made of titanium (Ti), molybdenum (Mo), tungsten (W), tantalum (Ta), niobium, indium tin oxide (ITO), aluminum (Al), Al alloy, silver (Ag), Ag alloy, copper (Cu), Cu alloy, carbon nanotube, graphite, graphene, or carbon nanobud. The first gate electrode 21, the second gate electrode 31, the source electrode 41s, the drain electrode 41d, the source connection wiring 43s, the drain connection wiring 43d, the anode electrode 50e, the cathode electrode 55e, and the cathode wiring 60 may be a single-layered film or a layered film.

For example, the semiconductor layer 25 is made of amorphous silicon, a microcrystalline oxide semiconductor, an amorphous oxide semiconductor, polysilicon, low-temperature polysilicon (hereinafter, referred to as low-temperature polycrystalline silicone (LTPS)), or gallium nitride (GaN). Examples of the oxide semiconductor include IGZO, zinc oxide (ZnO), and ITZO. IGZO is indium gallium zinc oxide. ITZO is indium tin zinc oxide.

For example, the insulation films 24, 29, 35, 45, and 70 are made of an inorganic insulation material such as a silicon oxide film ($SiO_2$), a silicon nitride film (SiN), and a silicon oxynitride film (SiON). The insulation films 24, 29, 45, and 70 are not limited to a single-layered film, but may also be a layered film. In particular, the insulation film 70 may also be made of aluminum oxide ($Al_2O_3$). For example, the insulation film 42 is made of an organic insulation material such as acrylic resin or epoxy resin. The insulation film 42 is also not limited to a single-layered film, but may also be a layered film. The planarization layer 80 is made of an organic insulation material such as epoxy resin and silicone resin. Alternatively, the planarization layer 80 is made of an organic/inorganic hybrid insulation film (for example, a material in which an organic group (methyl group or phenyl group) is bonded to the main chain of Si—O).

Figure 6:
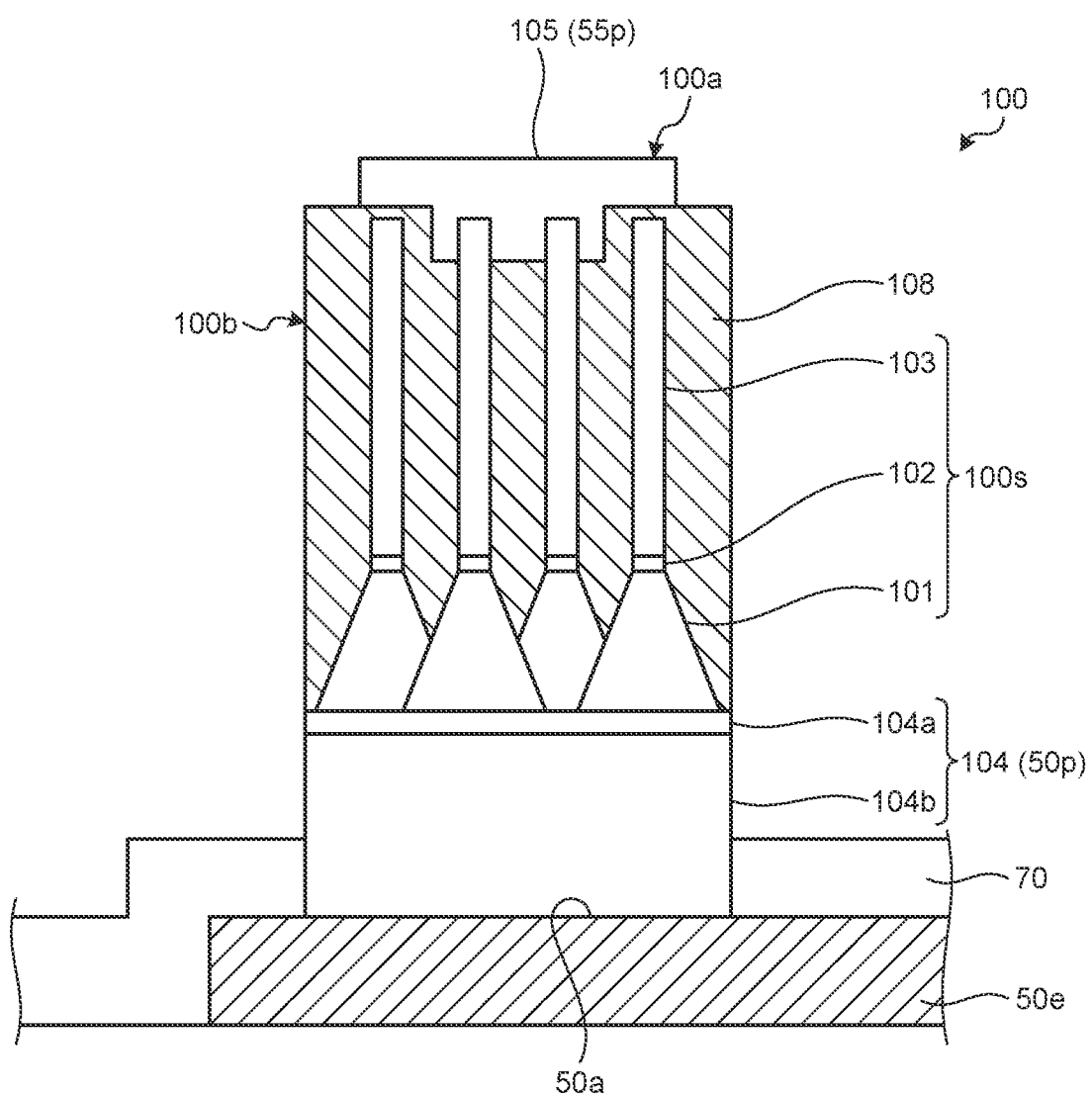
FIG. 6 is a sectional view illustrating a configuration example of the inorganic light emitting element according to the first embodiment.

FIG. 6 is a sectional view illustrating a configuration example of the inorganic light emitting element according to the first embodiment. As illustrated in FIG. 6, the inorganic light emitting element 100 includes a plurality of partial light emitting elements 100s, a protection layer 108 that covers the partial light emitting elements 100s, a p-type electrode 104 (including an anode terminal 50p), and an n-type electrode 105 (including the cathode terminal 55p). The partial light emitting elements 100s are each formed in a columnar shape between the p-type electrode 104 and the n-type electrode 105. The partial light emitting elements 100s each include an n-type cladding layer 103, an active layer 102, and a p-type cladding layer 101. The n-type electrode 105 is electrically coupled to the n-type cladding layer 103. The p-type electrode 104 is electrically coupled to the p-type cladding layer 101. The p-type cladding layer 101, the active layer 102, the n-type cladding layer 103, and the p-type electrode 105 are stacked on the p-type electrode 104 in the order as listed.

The n-type cladding layer 103, the active layer 102, and the p-type cladding layer 101 are light emitting layers, and for example, are each a compound semiconductor such as gallium nitride (GaN) and aluminum indium phosphide (AlInP).

The n-type electrode 105 is formed of a translucent conductive material such as ITO. The n-type electrode 105 is the cathode terminal 55p (second terminal) of the inorganic light emitting element 100 and is coupled to the cathode electrode 55e. The p-type electrode 104 is the anode terminal 50p (first terminal) of the inorganic light emitting element 100 and includes a platinum (Pt) layer 104a and a thick Au layer 104b formed by metal plating. The thick Au layer 104b is coupled to a mounting surface 50a of the anode electrode 50e. For example, the protection layer 108 is spin on glass (SOG). The side surface of the protection layer 108 is a side surface 100b of the inorganic light emitting element 100.

As described above, the display apparatus 1 according to the first embodiment includes the substrate 10, the pixels 49 that are disposed on the substrate 10 and that display different colors, the inorganic light emitting element 100 provided in each of the pixels 49, and the translucent cathode electrode 55e (electrode) that is provided on the one surface 10a side of the substrate 10 and that is coupled to the inorganic light emitting element 100. The display apparatus 1 also includes the translucent adhesion layer 150 (first conductive layer) that is provided on the one surface 10a side of the substrate 10 and that covers the cathode electrode 55e, and the cover member 160 that is provided on the one surface 10a side of the substrate 10 and that covers the adhesion layer 150. The sheet resistance value of the adhesion layer 150 is higher than the sheet resistance value of the cathode electrode 55e.

Consequently, the static electricity applied to the display apparatus 1 from the cover member 160 side flows through the adhesion layer 150. The sheet resistance value of the adhesion layer 150 is higher than that of the cathode electrode 55e. Therefore, the electrostatic voltage is reduced while the static electricity flows through the adhesion layer 150. Thus, the display apparatus 1 can remove the static electricity in a short period of time and reduce the static electricity on the inorganic light emitting element 100. The display apparatus 1 can improve the ESD resistance.

The adhesion layer 150 is coupled to the cathode wiring 60 at the bottom portion of the contact hole H11 via the cathode electrode 55e. The cathode wiring 60 is coupled to the ground potential. Consequently, the static electricity that flows through the adhesion layer 150 flows to the ground potential side. Thus, it is possible to prevent electromagnetic noise such as static electricity from damaging the inorganic light emitting element 100. Thus, the display apparatus 1 can further improve the ESD resistance.

The adhesion layer 150 also bonds the cover member 160 to the one surface 10a side of the substrate 10. Consequently, a dedicated adhesion layer for bonding the cover member 160 is not required, and it is possible to reduce the thickness of the display apparatus 1.

As illustrated in FIG. 5, the display apparatus 1 also includes the transistor Tr3 that is provided on the one surface 10a side of the substrate 10 and that is coupled to the inorganic light emitting element 100, and the power supply line LVDD wiring provided on the one surface 10a side of the substrate 10. The first capacitor CS1 is formed between the transistor Tr3 and the inorganic light emitting element 100. The second capacitor CS2 is formed between the power supply line LVDD and the inorganic light emitting element 100. Consequently, the first capacitor CS1 and the second capacitor CS2 can accommodate the change in voltage applied to the inorganic light emitting element 100, by charging and discharging. Thus, the first capacitor CS1 and the second capacitor CS2 can protect the inorganic light emitting element 100 from the change in electrostatic voltage.

In the first embodiment described above, the adhesion layer 150 has a conductive property. However, in the first embodiment, the adhesion layer 150 may also have an insulating property. In this case, a high-resistance conductive film may be provided between the adhesion layer 150 and the cover member 160.

Figure 7:
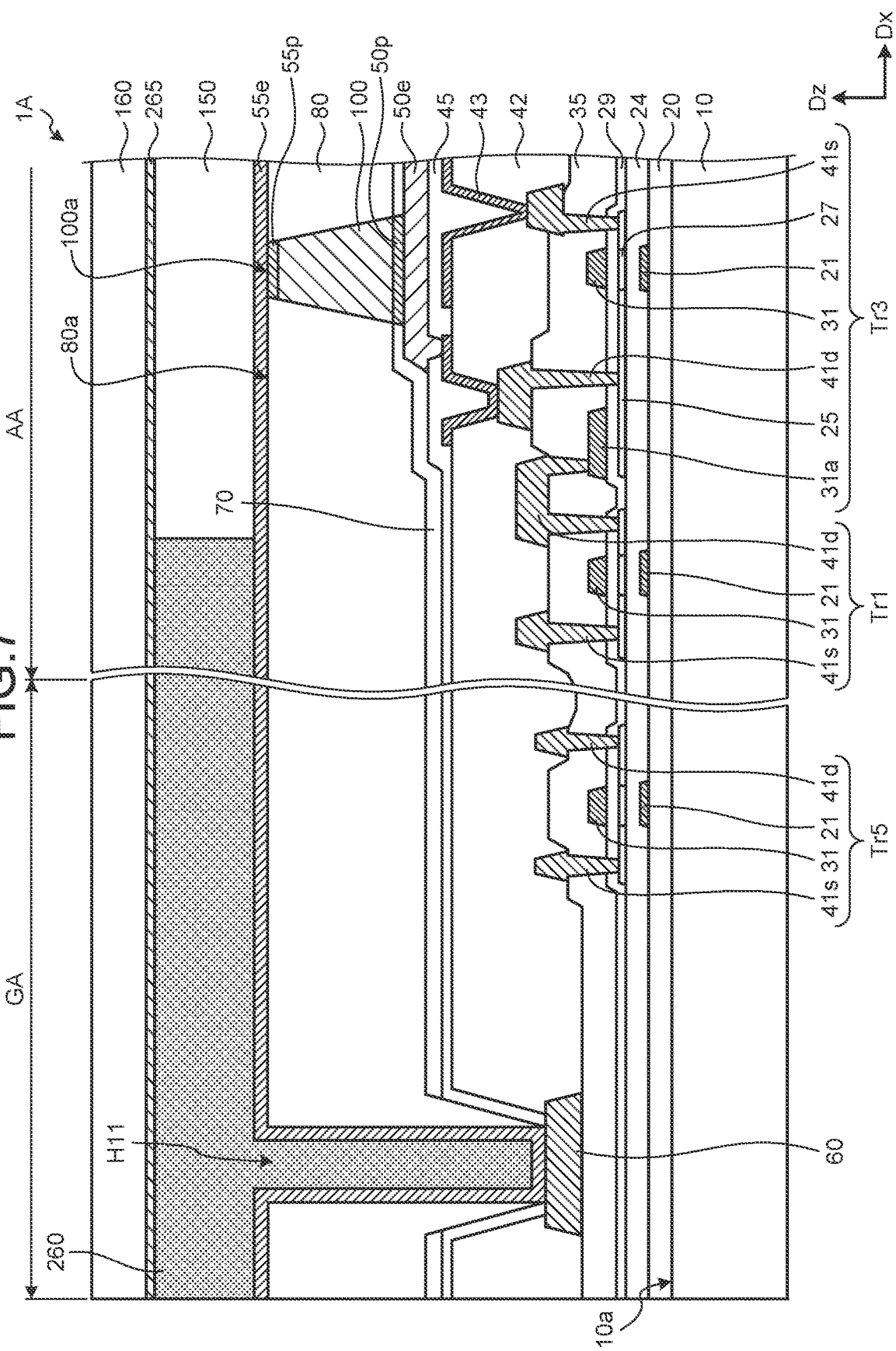
FIG. 7 is a sectional view illustrating a display apparatus according to a modification of the first embodiment.
Figure 8:
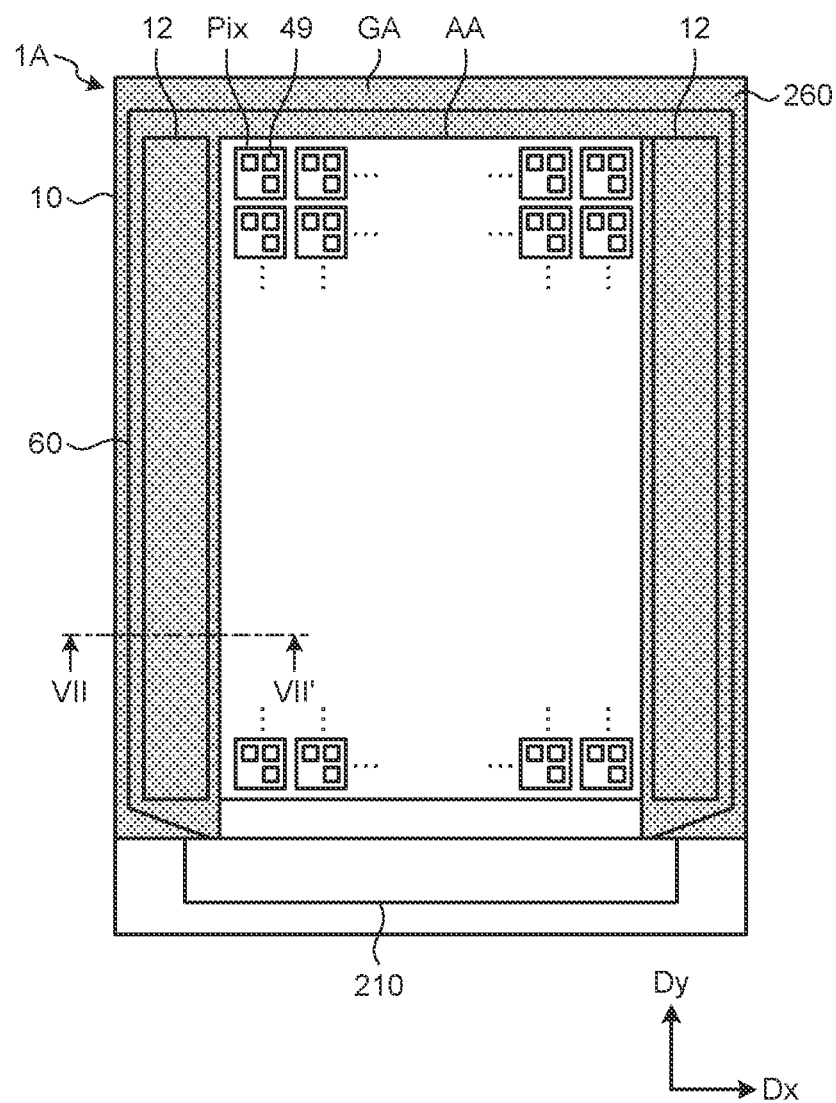
FIG. 8 is a plan view illustrating the display apparatus according to the modification of the first embodiment.

FIG. 7 is a sectional view illustrating a display apparatus according to a modification of the first embodiment. FIG. 8 is a plan view illustrating the display apparatus according to the modification of the first embodiment. FIG. 7 corresponds to a cross-section cut along a line VII-VII' in FIG. 8.

As illustrated in FIG. 7, a display apparatus 1A includes a light-shielding conductive layer 260 and a high-resistance conductive film 265. In the display apparatus 1A, the adhesion layer 150 is provided on the cathode electrode 55e in the display region AA and is not provided on the cathode electrode 55e in the peripheral region GA.

The conductive layer 260 is provided on the cathode electrode 55e in the peripheral region GA. The conductive layer 260 has the contact hole H11 and flattens the one surface 10a side of the substrate 10. The side surface of the adhesion layer 150 and the side surface of the conductive layer 260 are in contact with each other in the vicinity of the boundary between the display region AA and the peripheral region GA.

As illustrated in FIG. 8, the conductive layer 260 covers the peripheral region GA. For example, the conductive layer 260 covers the drive circuit 12 provided in the peripheral region GA. The conductive layer 260 is a conductive black matrix.

The high-resistance conductive film 265 is continuously provided on the adhesion layer 150 in the display region AA and the conductive layer 260 in the peripheral region GA. The cover member 160 is also provided on the high-resistance conductive film 265. The high-resistance conductive film 265 is in contact with the adhesion layer 150, the conductive layer 260, and the cover member 160. The sheet resistance value of the high-resistance conductive film 265 is higher than the sheet resistance value of the cathode electrode 55e. The sheet resistance value of the high-resistance conductive film 265 is equal to or less than $10^{12}$ Ω/sq. The high-resistance conductive film 265 is a conductive film made of ITO, indium zinc oxide (IZO), TNO, an organic film, or the like.

Examples of the high-resistance conductive film 265 include ITO, IZO, $SnO_2$, an organic conductive film, and the like. Alternatively, the high-resistance conductive film 265 may also include insulating oxide, in addition to one or more materials of ITO, IZO, and $SnO_2$. The high-resistance conductive film 265 may also be an oxide layer the main components of which are tin oxide ($SnO_2$) and silicon dioxide ($SiO_2$); an oxide layer the main components of which are gallium oxide ($Ga_2O_3$), indium oxide ($In_2O_3$), and tin oxide ($SnO_2$); a translucent conductive layer the main material of which is ITO and that contains silicon (Si); and the like.

More specifically, a material of the translucent conductive layer (hereinafter, may also be referred to as a translucent conductive material) forming the high-resistance conductive film 265 may be a material the base material of which is indium oxide ($In_2O_3$), added with one or more of tin (Sn), germanium (Ge), molybdenum (Mo), fluorine (F), titanium (Ti), zirconium (Zr), hafnium (Hf), niobium (Nb), tantalum (Ta), tungsten (W), and tellurium (Te) as a dopant.

The translucent conductive material forming the high-resistance conductive film 265 may also be a material the base material of which is zinc oxide (ZnO), added with one or more of aluminum (Al), gallium (Ga), boron (B), indium (In), yttrium (Y), scandium (Sc), fluorine (F), vanadium (V), silicon (Si), germanium (Ge), titanium (Ti), zirconium (Zr), and hafnium (Hf).

The translucent conductive material forming the high-resistance conductive film 265 may also be a material the base material of which is tin oxide ($S_nO_2$), added with one or more of antimony (Sb), fluorine (F), arsenic (As), niobium (Nb), and tantalum (Ta).

Silicon dioxide ($SiO_2$) is added, as a high-resistance component, to these translucent conductive materials. A mixing ratio of one or more base materials of indium oxide ($In_2O_3$), zinc oxide (ZnO), and tin oxide ($S_nO_2$); the dopant described above; and silicon dioxide ($SiO_2$) as a high-resistance component is determined such that the translucent conductive material has a predetermined sheet resistance.

More specifically, the organic conductive film forming the high-resistance conductive film 265 is a conductive polymer material that contains poly-3,4-ethylenedioxythiophene (PEDOT)-Polystyrene sulfonate (PSS), and the like. PEDOT-PSS added with alkali metal and a high-resistance component is used as the conductive material. For example, the alkali metal is lithium (Li), sodium (Na), and potassium (K). For example, the high-resistance component is tetraethyl orthosilicate (TEOS).

In this manner, the display apparatus 1A according to the modification of the first embodiment includes the translucent high-resistance conductive film 265 (first conductive layer) that is provided on the one surface 10a side of the substrate 10 and that covers the cathode electrode 55e, and the light-shielding conductive layer 260 (second conductive layer) that is provided on the one surface 10a side of the substrate 10 and that is coupled to the high-resistance conductive film 265. The conductive layer 260 is arranged in the peripheral region GA. Consequently, the conductive layer 260 can cause the static electricity to flow from the display region AA to the peripheral region GA. The conductive layer 260 also has a light-shielding property. The conductive layer 260 prevents external light from entering the peripheral region GA. Thus, in the peripheral region GA, light is prevented from reflecting on a wiring surface.

Second Embodiment

Figure 9:
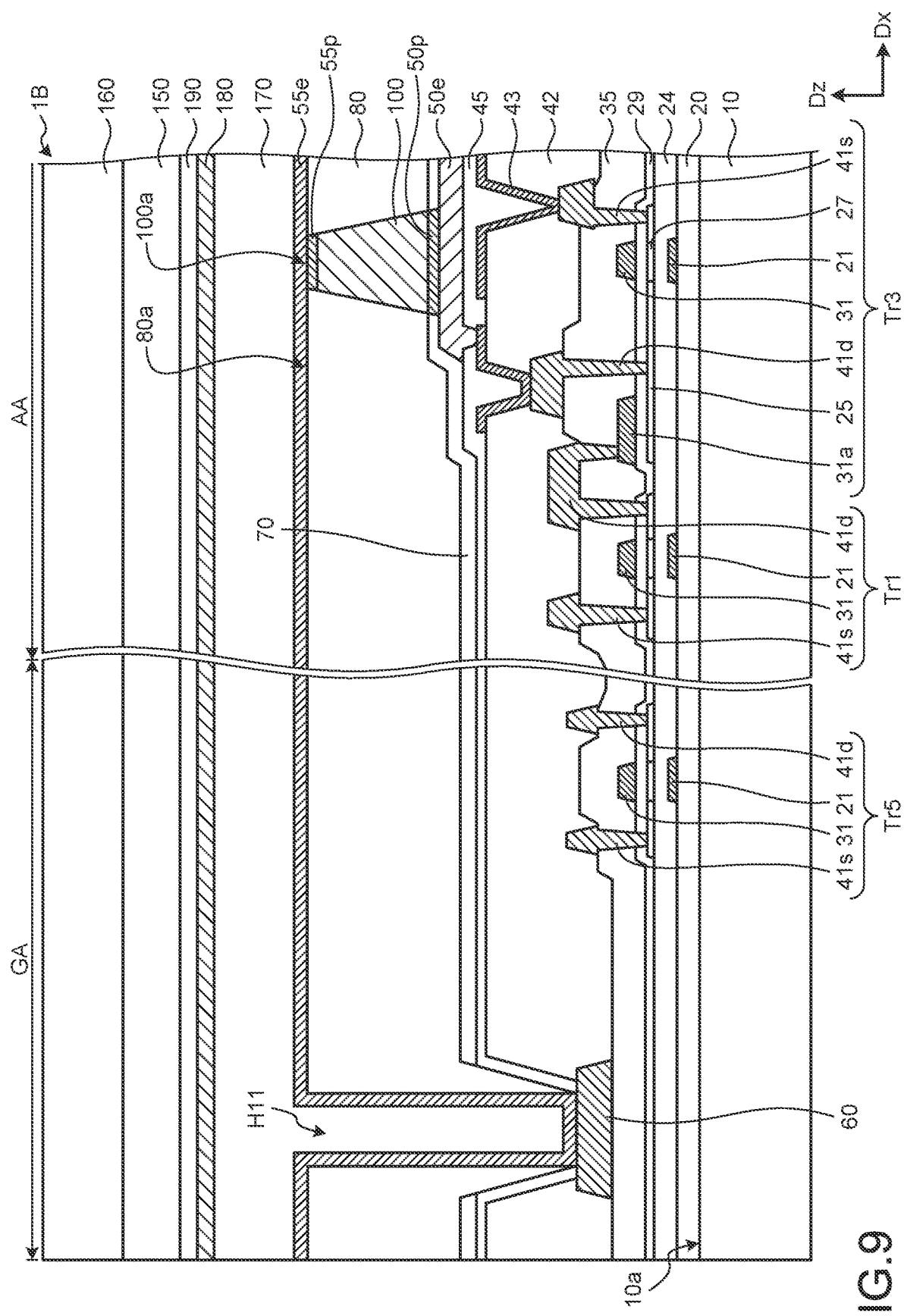
FIG. 9 is a sectional view illustrating a configuration example of a display apparatus according to a second embodiment.

The display apparatus according to the embodiment may also include a circularly polarizing plate that suppresses the reflection of external light. FIG. 9 is a sectional view illustrating a configuration example of a display apparatus 1B according to a second embodiment. As illustrated in FIG. 9, the display apparatus 1B according to the second embodiment includes a translucent planarization layer 170, a translucent adhesion layer 180, and a circularly polarizing plate 190. The planarization layer 170 is made of insulating resin. The planarization layer 170 is provided on the cathode electrode 55e. The planarization layer 170 has the contact hole H11 and flattens the one surface 10a side of the substrate 10.

The adhesion layer 180 is an adhesive for a polarizing plate used for fixing the circularly polarizing plate 190 on the one surface 10a side of the substrate 10. The adhesion layer 180 is made of conductive resin, such as acrylic polymer containing a conductive material. The sheet resistance value of the adhesion layer 180 is higher than the sheet resistance value of the cathode electrode 55e. The sheet resistance value of the adhesion layer 180 is equal to or less than $10^{12}$ Ω/sq. The adhesion layer 180 is provided on the planarization layer 170.

For example, the circularly polarizing plate 190 includes a linearly polarizing plate and a ¼ retardation plate (may also be referred to as a ¼ wavelength plate) provided on one surface side of the linearly polarizing plate. The ¼ retardation plate is located at a position closer to the substrate 10 than the linearly polarizing plate is. For example, external light (incident light) is changed to linearly polarized light by passing through the linearly polarizing plate. The linearly polarized light is changed to circularly polarized light by passing through the ¼ retardation plate. The circularly polarized light is reflected by wiring and becomes circularly polarized light (reflection light) that rotates in a direction opposite from the incident light. By passing through the ¼ retardation plate again, the reflection light becomes linearly polarized light in a direction orthogonal to the incident direction and is absorbed by the linearly polarizing plate. Thus, the display apparatus 1B suppresses the reflection of the external light.

The adhesion layer 150 is provided on the circularly polarizing plate 190. The adhesion layer 150 may have a conductive property or an insulating property.

The static electricity applied to the display apparatus 1B from the cover member 160 side flows through the conductive adhesion layer 180. The sheet resistance value of the adhesive layer 180 is higher than that of the cathode electrode 55e. Therefore, the electrostatic voltage is reduced while the static electricity flows through the adhesion layer 180. Thus, the display apparatus 1B can remove the static electricity in a short period of time and reduce the static electricity on the inorganic light emitting element 100. Thus, the display apparatus 1B can improve the ESD resistance.

In this manner, the display apparatus 1B according to the second embodiment includes the circularly polarizing plate 190 provided between the substrate 10 and the cover member 160. The adhesion layer 180 (first conductive layer) is provided between the substrate 10 and the circularly polarizing plate 190 and bonds the circularly polarizing plate 190 to the one surface 10a side of the substrate 10. Consequently, the circularly polarizing plate 190 absorbs the light that has passed through the circularly polarizing plate 190 and that is reflected by a wiring surface. Thus, for example, even when external light (for example, strong visible light) enters the screen of the display apparatus 1B in the outside, the display apparatus 1B can suppress the reflection of the external light and prevent luminance degradation. Thus, the display apparatus 1B can improve the contrast of an image and prevent the image quality from degrading. Because a dedicated adhesion layer for bonding the circularly polarizing plate 190 is not required, it is possible to reduce the thickness of the display apparatus 1B.

Figure 10:
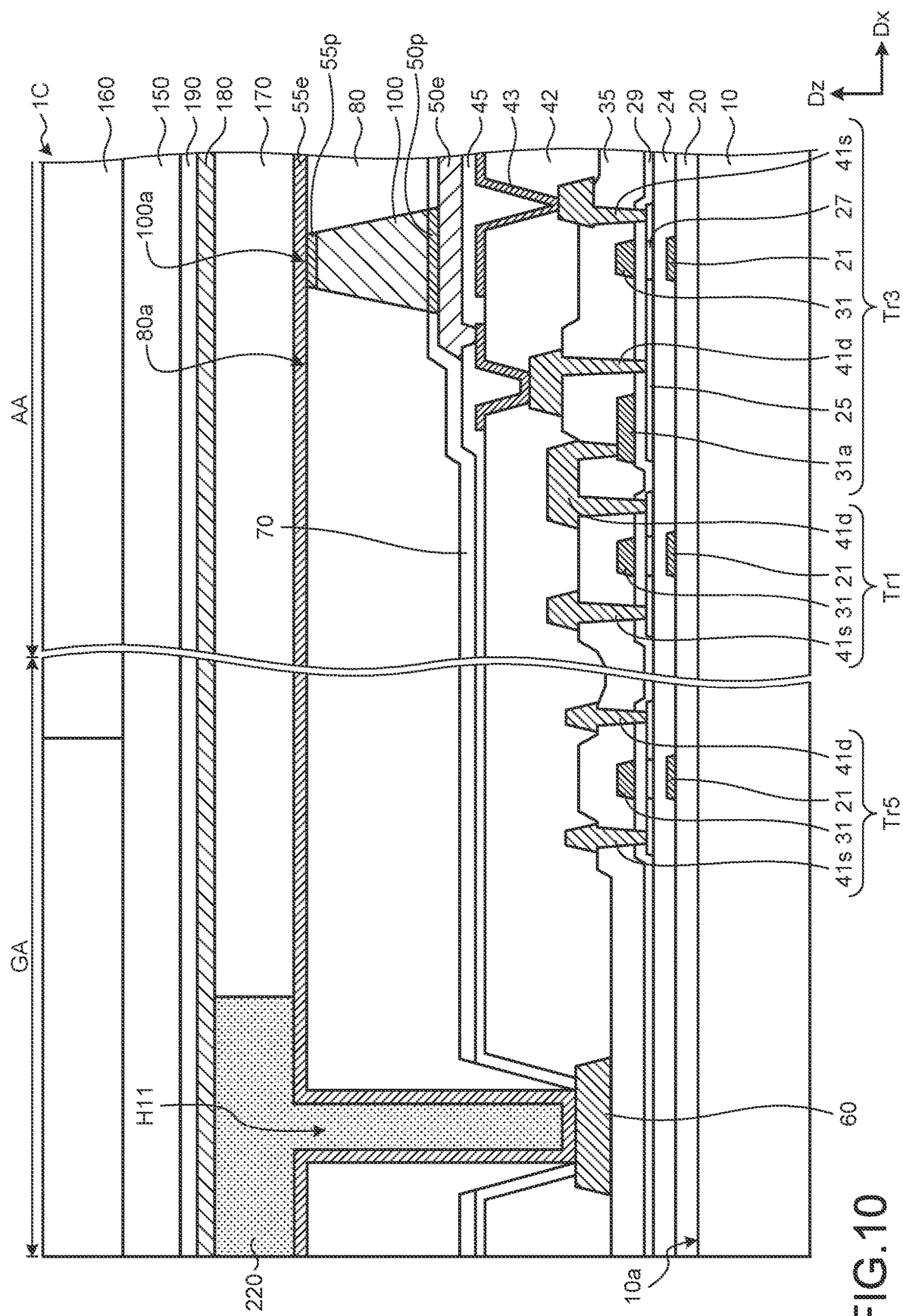
FIG. 10 is a sectional view illustrating a display apparatus according to a modification of the second embodiment.

FIG. 10 is a sectional view illustrating a display apparatus according to a modification of the second embodiment. As illustrated in FIG. 10, a display apparatus 1C according to a modification of the second embodiment includes a light-shielding conductive layer 220. The conductive layer 220 is provided on the cathode electrode 55e in the peripheral region GA. The conductive layer 220 has the contact hole H11 and flattens the one surface 10a side of the substrate 10. The conductive layer 220 also covers the upper side of the cathode wiring 60. For example, the conductive layer 220 is a conductive black matrix. In the peripheral region GA, the side surface of the conductive layer 220 and the side surface of the planarization layer 170 are in contact with each other.

The conductive layer 220 is coupled to the cathode wiring 60 at the bottom portion of the contact hole H11 via the cathode electrode 55e. The cathode wiring 60 is coupled to the fixed potential (for example, ground potential). Consequently, the display apparatus 1C can release, to the ground potential, the static electricity that flows through the adhesion layer 150, and further reduce the static electricity on the inorganic light emitting element 100. The display apparatus 1C can further improve the ESD resistance.

The conductive layer 220 is arranged in the peripheral region GA. Consequently, the conductive layer 220 can release the static electricity from the display region AA to the peripheral region GA. The conductive layer 220 also has a light-shielding property. The conductive layer 220 prevents external light from entering the peripheral region GA. Thus, in the peripheral region GA, light is prevented from reflecting on a wiring surface.

A conductive layer (for example, the adhesion layer 150) having a sheet resistance value higher than the cathode electrode 55e may also be provided on the surface of the circularly polarizing plate 190. The sheet resistance value of the conductive layer is equal to or less than $10^{12}$ Ω/sq. Consequently, even when the adhesion layer 180 has an insulating property, the electrostatic voltage is reduced while the static electricity flows through the conductive layer provided on the surface of the circularly polarizing plate 190.

Third Embodiment

Figure 11:
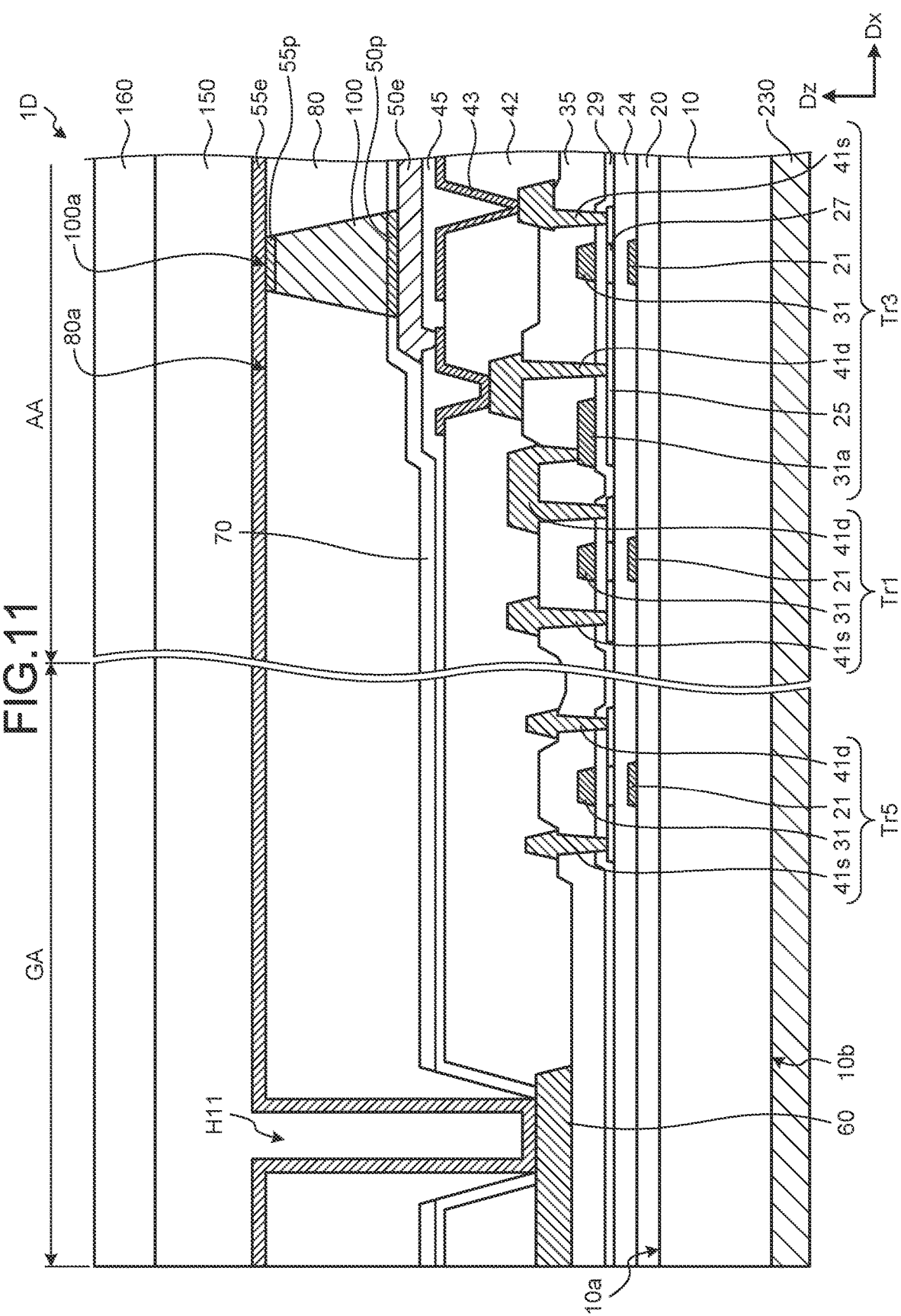
FIG. 11 is a sectional view illustrating a configuration example of a display apparatus according to a third embodiment.

FIG. 11 is a sectional view illustrating a configuration example of a display apparatus according to a third embodiment. As illustrated in FIG. 11, a display apparatus 1D according to the third embodiment includes a conductive layer 230 (third conductive layer). The conductive layer 230 is provided on another surface 10b side of the substrate 10 that is located on the opposite side from the one surface 10a. The resistance value of the conductive layer 230 is equal to or more than 0.1Ω and equal to or less than 1000Ω. For example, the conductive layer 230 is made of Ti or Al.

Consequently, the voltage of the static electricity on the other surface 10b side of the substrate 10 is reduced, while the static electricity flows through the conductive layer 230. Thus, the display apparatus 1D can remove the static electricity in a short period of time and reduce the static electricity on the inorganic light emitting element 100.

FIG. 11 illustrates the conductive layer 230 provided on the entire other surface 10b of the substrate 10. However, this is merely an example. For example, the conductive layer 230 may also be provided partially on a region that faces the display region AA, instead of the entire other surface 10b of the substrate 10.

Figure 12:
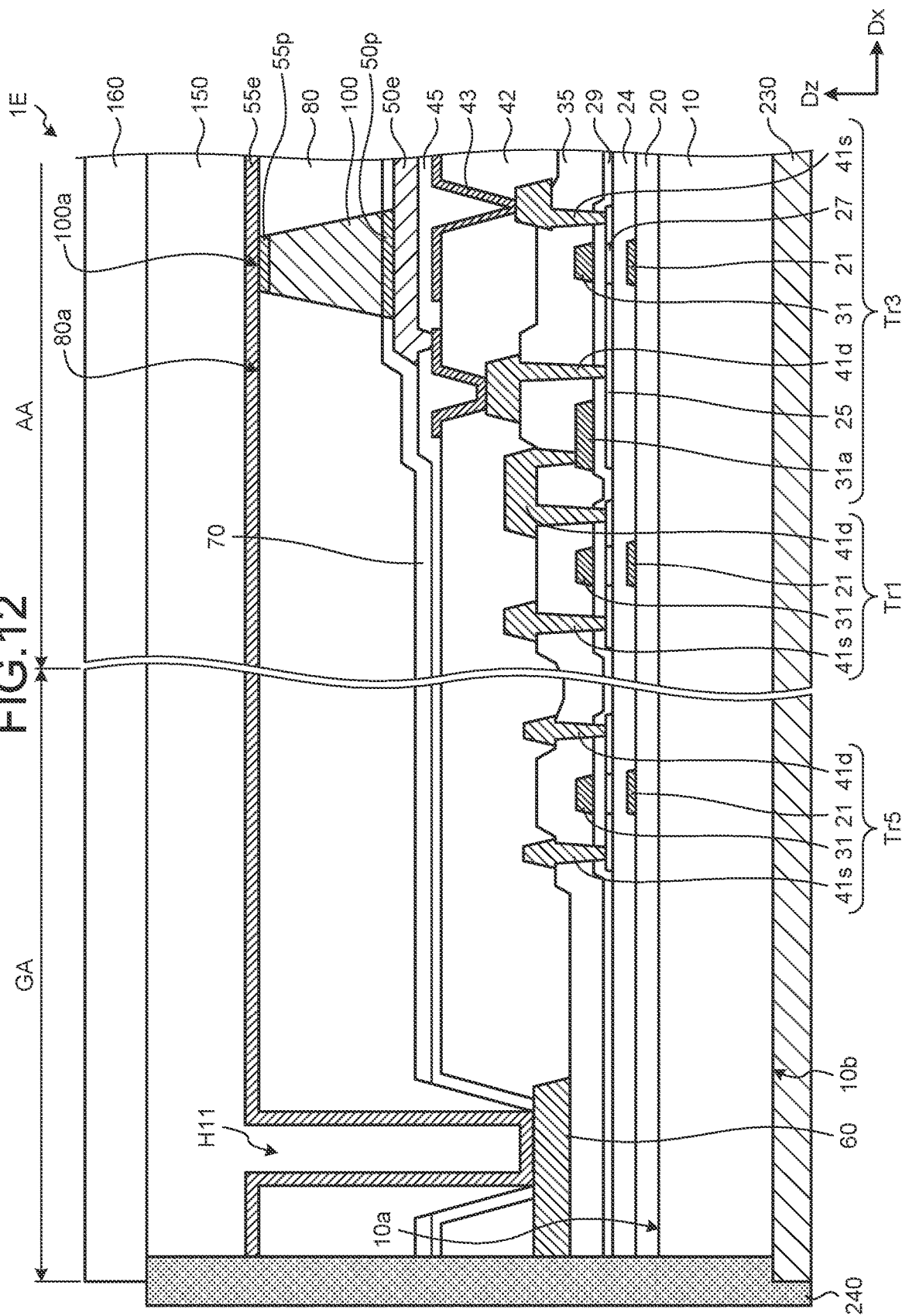
FIG. 12 is a sectional view illustrating a display apparatus according to a modification of the third embodiment.
Figure 13:
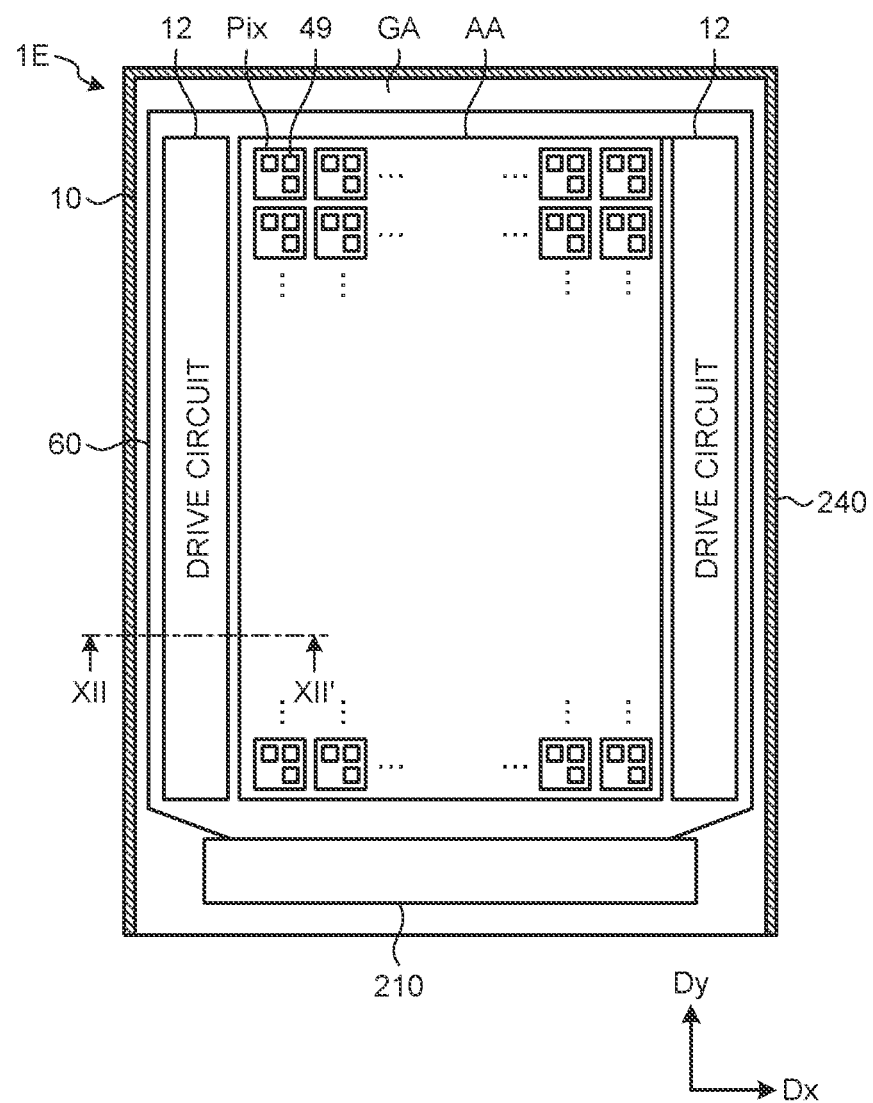
FIG. 13 is a plan view illustrating the display apparatus according to the modification of the third embodiment.

FIG. 12 is a sectional view illustrating a display apparatus according to a modification of the third embodiment. FIG. 13 is a plan view illustrating the display apparatus according to the modification of the third embodiment. FIG. 12 corresponds to a cross-section cut along a line XII-XII' in FIG. 13. As illustrated in FIG. 12, a display apparatus 1E according to a modification of the third embodiment includes a light-shielding conductive layer 240 that couples the conductive layer 230 and the cathode wiring 60. In the side surface of the display apparatus 1E, the conductive layer 240 covers an area from the conductive layer 230 to the adhesion layer 150. As illustrated in FIG. 13, the conductive layer 240 covers the periphery of the display apparatus 1E. For example, when the shape of the display apparatus 1E is a rectangular shape in a plan view, the conductive layer 240 continuously covers the three sides of the rectangle. The conductive layer 230 may be coupled to the cathode wiring 60 or the cathode electrode 55e and may not cover the side surface of the adhesion layer 150 or the planarization layer 80. The conductive layer 230 may also partially cover a part of the periphery of the display apparatus 1E.

In this manner, the display apparatus 1E according to the modification of the third embodiment includes the light-shielding conductive layer 240 (fourth conductive layer) that is arranged on the side surface of the substrate 10 and that is coupled to the conductive layer 230. Consequently, the conductive layer 230 is coupled to the cathode wiring 60 via the conductive layer 240. The cathode wiring 60 is coupled to the ground potential (fixed potential). Thus, the display apparatus 1E can release the static electricity that flows through the conductive layer 230 to the ground potential and can prevent electromagnetic noise such as static electricity from damaging the inorganic light emitting element 100. The display apparatus 1E can still further improve the ESD resistance.

The conductive layer 240 has a light-shielding property. Thus, it is possible to prevent the light emitted from the inorganic light emitting element 100 from leaking to the outside from the periphery of the substrate 10.

Fourth Embodiment

Figure 14:
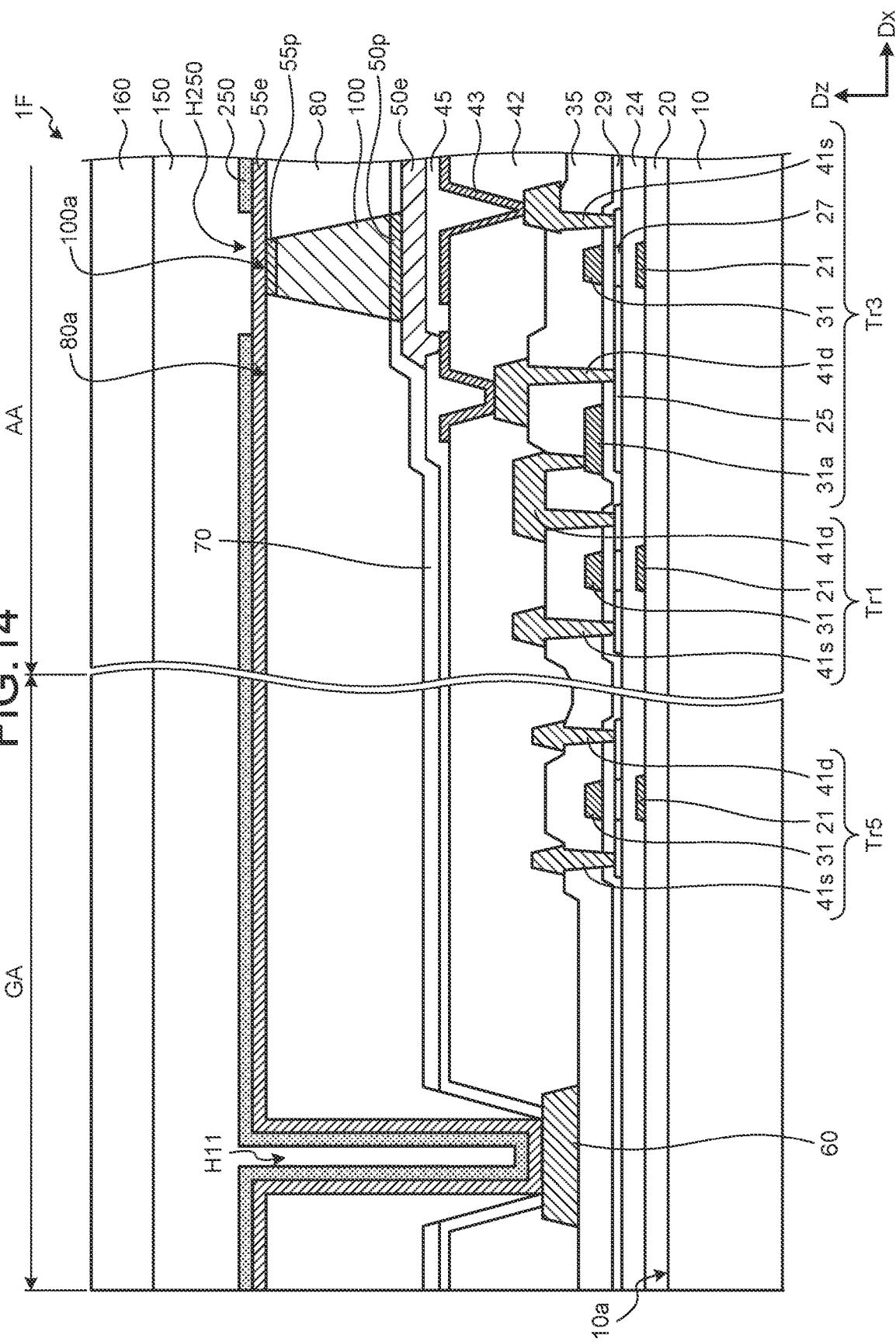
FIG. 14 is a sectional view illustrating a configuration example of a display apparatus according to a fourth embodiment.
Figure 15:
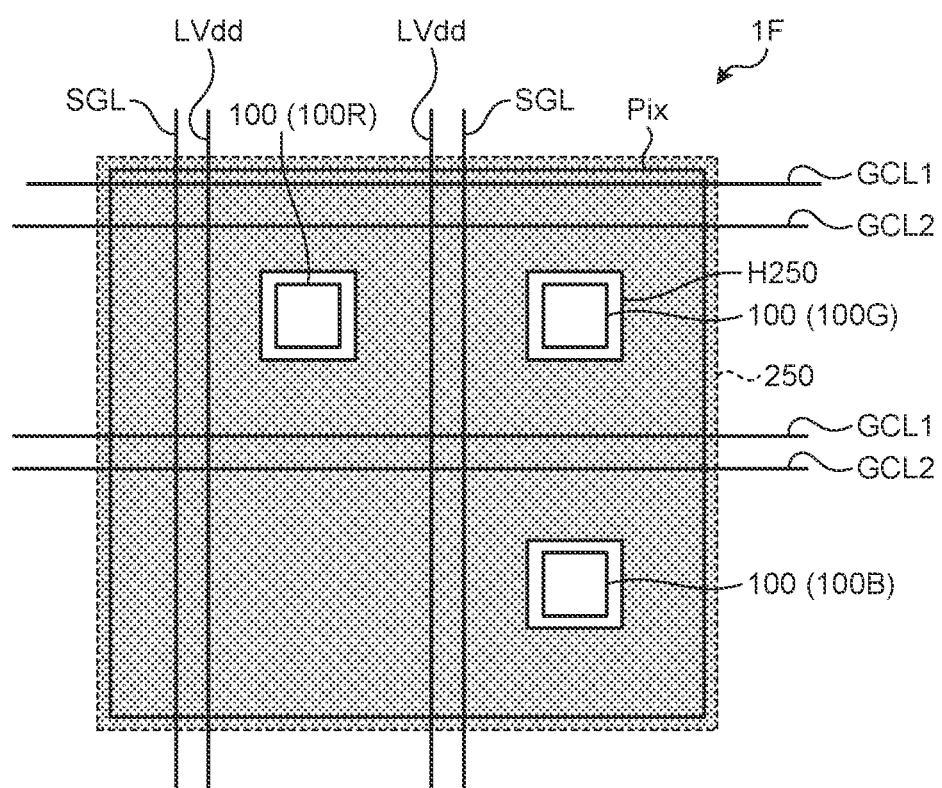
FIG. 15 is a plan view illustrating a configuration example of a pixel according to the fourth embodiment.

FIG. 14 is a sectional view illustrating a configuration example of a display apparatus according to a fourth embodiment. FIG. 15 is a plan view illustrating a configuration example of a pixel according to the fourth embodiment. As illustrated in FIG. 14, a display apparatus 1F according to the fourth embodiment includes a light-shielding conductive layer 250 (first conductive layer) arranged on the cathode electrode 55e. The sheet resistance value of the conductive layer 250 is higher than the sheet resistance value of the cathode electrode 55e. The sheet resistance value of the conductive layer 250 is equal to or less than $10^{12}$ Ω/sq. For example, the conductive layer 250 is a conductive black matrix. The conductive layer 250 also has an opening H250 that is opened above the inorganic light emitting element 100. The adhesion layer 150 is in contact with the cathode electrode 55e via the opening H250.

As illustrated in FIG. 15, the light-shielding conductive layer 250 covers the pixel Pix. In a plan view, the opening H250 is arranged so as to cover inorganic light emitting elements 100R, 100G, and 100B. Thus, the light emitted from each of the inorganic light emitting elements 100R, 100G, and 100B passes through the opening H250 and is output to the cover member 160 side.

The wiring included in the pixel circuit of the pixel Pix is covered by the light-shielding conductive layer 250. Examples of the wiring included in the pixel circuit include the first gate line GCL1, the second gate line GCL2, the signal line SGL, the power supply line LVDD (wiring), and the like. Thus, because the reflection of external light by the wiring is reduced, it is possible to improve the contrast of an image and improve the quality of the image on the display apparatus 1F.

Fifth Embodiment

Figure 16:
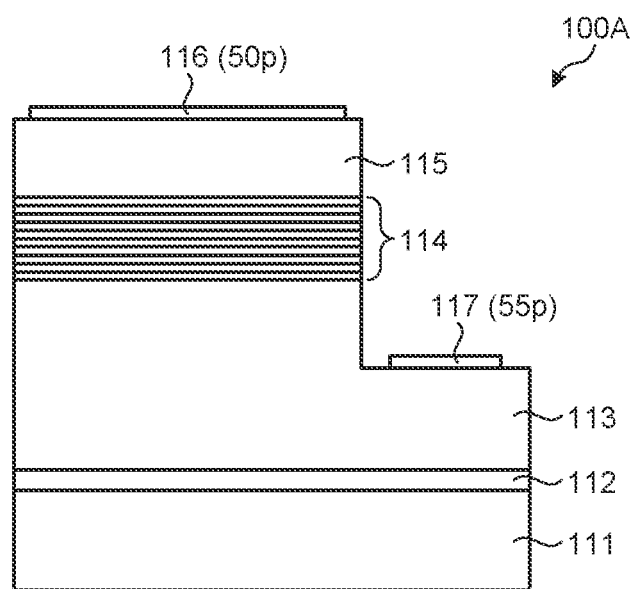
FIG. 16 is a sectional view illustrating a configuration example of an inorganic light emitting element according to a fifth embodiment.

The form of the inorganic light emitting element according to the embodiment is not limited to that illustrated in FIG. 6. The form of the inorganic light emitting element may be as illustrated in FIG. 16. FIG. 16 is a sectional view illustrating a configuration example of an inorganic light emitting element according to a fifth embodiment. As illustrated in FIG. 16, an inorganic light emitting element 100A according to the fifth embodiment includes a substrate 111, a buffer layer 112, an n-type cladding layer 113, an active layer 114, a p-type cladding layer 115, a p-type electrode layer 116 (anode terminal 50p), and an n-type electrode layer 117 (cathode terminal 55p). The buffer layer 112, the n-type cladding layer 113, the active layer 114, the p-type cladding layer 115, and the p-type electrode layer 116 are stacked from one surface side of the substrate 111 in the order as listed. A region exposed from the active layer 114 is provided on the n-type cladding layer 113. The n-type electrode layer 117 is provided in this region.

For example, the substrate 111 is made of sapphire. The n-type cladding layer 113 is made of n-type GaN. The active layer 114 is made of InGaN. The p-type cladding layer 115 is made of p-type GaN. The p-type electrode layer 116 is made of palladium (Pd) and gold (Au), and has a layered structure in which Au is stacked on Pd. The n-type electrode layer 117 is made of indium (In).

In the inorganic light emitting element 100A, the p-type cladding layer 115 and the n-type cladding layer 113 are not in direct contact with each other, and another layer (active layer 114) is interposed therebetween. Thus, it is possible to cause carriers such as electrons and holes to be confined in the active layer 114 and to be efficiently recombined (to efficiently emit light). A multiple quantum well structure (MQW structure) in which a well layer and a barrier layer formed of several atomic layers are periodically stacked may also be used as the active layer 114 to improve efficiency.

MODIFICATION

Figure 17:
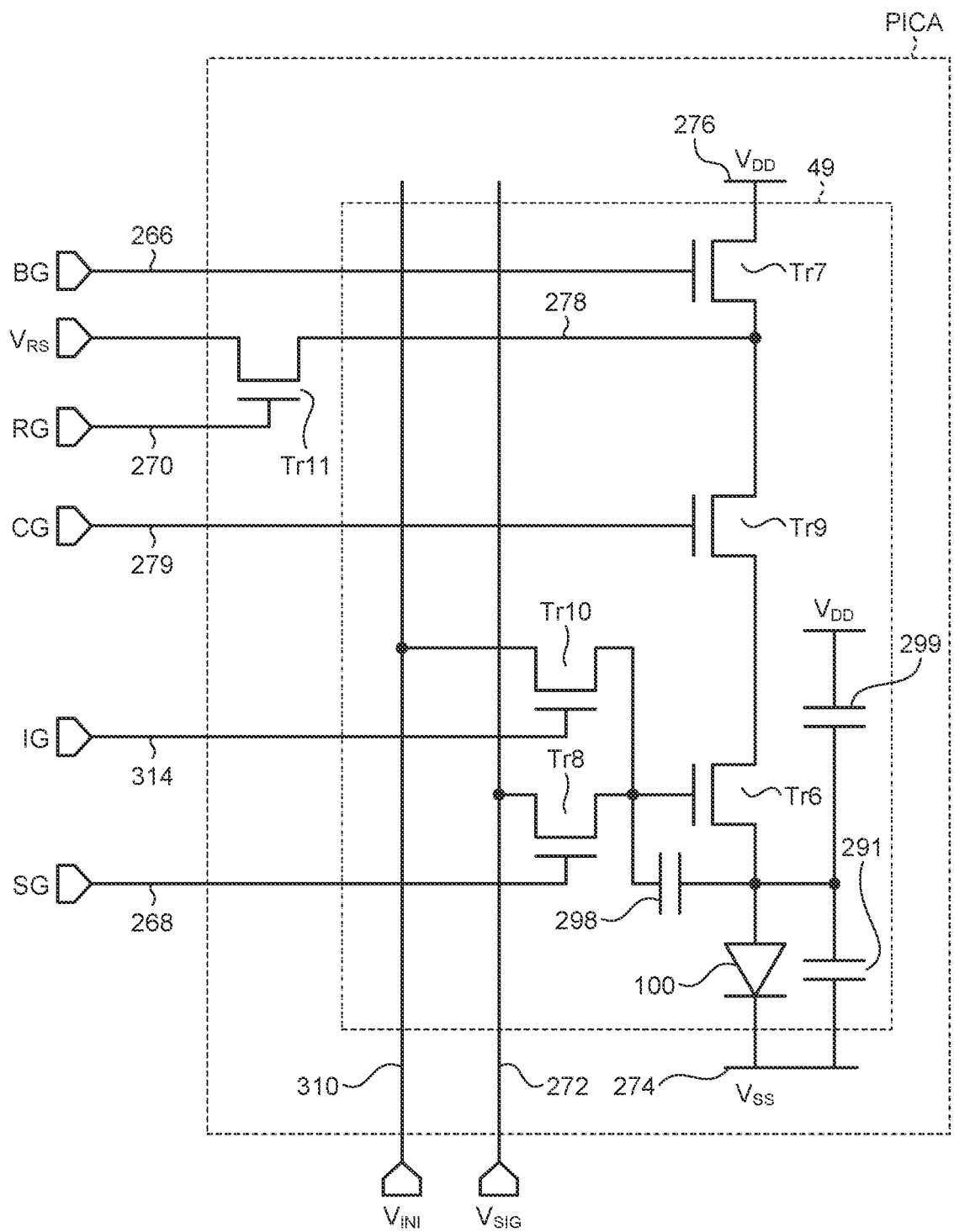
FIG. 17 is a circuit diagram illustrating a pixel circuit according to a modification of the embodiments.

The configuration of the pixel circuit according to the embodiments is not limited to that illustrated in FIG. 3. FIG. 17 is a circuit diagram illustrating a pixel circuit according to a modification of the embodiments. As illustrated in FIG. 17, a pixel circuit PICA according to a modification of the embodiment includes a drive transistor Tr6, a lighting switch Tr7, a writing switch Tr8, a light emitting control switch Tr9, an initialization switch Tr10, and a reset switch Tr11.

A cathode (cathode terminal 90p) of the inorganic light emitting element 100 is coupled to a power supply line 274. An anode (anode terminal 50p) of the light emitting element 100 is coupled to a power supply line 276 via the drive transistor Tr6 and the lighting switch Tr7.

A predetermined high potential is applied to the power supply line 276 from the drive power supply as a drive potential $V_{DD}$. A predetermined low potential is applied to the power supply line 274 from the power supply circuit as a reference potential $V_{SS}$.

When a forward current (drive current) is supplied to the inorganic light emitting element 100 by a potential difference ($V_{DD}-V_{SS}$) between the drive potential $V_{DD}$ and the reference potential $V_{SS}$, the inorganic light emitting element 100 emits light. In other words, the drive potential $V_{DD}$ has a potential difference with respect to the reference potential $V_{SS}$, to cause the inorganic light emitting element 100 to emit light. The inorganic light emitting element 100 is configured such that a capacitor 291 is coupled as an equivalent circuit in parallel between the anode terminal 50p and the cathode terminal 90p. An additional capacitor 299 is also provided between the anode terminal 50p of the inorganic light emitting element 100 and the power supply line 276 that supplies the drive potential $V_{DD}$. The capacitor 291 may also be coupled to another reference potential other than the anode terminal 50p and the cathode terminal 90p.

In the present embodiment, the drive transistor Tr6, the lighting switch Tr7, and the light emitting control switch Tr9 are each formed of an n-type TFT. The source electrode of the drive transistor Tr6 is coupled to the anode terminal 50p of the inorganic light emitting element 100, and the drain electrode thereof is coupled to the source electrode of the light emitting control switch Tr9. The gate electrode of the light emitting control switch Tr9 is coupled to a light emitting control line 279. The drain electrode of the light emitting control switch Tr9 is coupled to the source electrode of the lighting switch Tr7. The gate electrode of the lighting switch Tr7 is coupled to a lighting control line 266. The drain electrode of the lighting switch Tr7 is coupled to the power supply line 276. The gate electrode of the reset switch Tr11 is coupled to a reset control line 270. The gate electrode of the writing switch Tr8 is coupled to a writing control line 268. The gate electrode of the initialization switch Tr10 is coupled to an initialization control line 314.

The drain electrode of the drive transistor Tr6 is also coupled to a reset power supply via the reset switch Tr11. In the present modification, a reset line 278 and the reset switch Tr11 are provided for each pixel row. Each reset line 278 extends along the pixel row and is commonly coupled to the drain electrode of the drive transistor Tr6 of the pixel row, via the light emitting control switch Tr9 of the pixel row. In other words, the pixels 49 forming the pixel row commonly use the reset line 278 and the reset switch Tr11. For example, the reset switch Tr11 is arranged at the end portion of the pixel row and switches between coupling and uncoupling the reset line 278 and the reset power supply. In other words, the reset switch Tr11 switches between coupling the reset line 278 and the reset power supply and uncoupling the reset line 278 and the reset power supply from each other. In the present modification, as with the drive transistor Tr6, the lighting switch Tr7, and the light emitting control switch Tr9, the reset switch Tr11 is also formed of an n-type TFT.

The gate electrode that is a control terminal of the drive transistor Tr6 is coupled to a video signal line 272 via the writing switch Tr8 and is coupled to an initialization signal line 310 via the initialization switch Tr10. A holding capacitor 298 is coupled between the gate electrode and the source electrode of the drive transistor Tr6. In the present embodiment, as with the drive transistor Tr6, the lighting switch Tr7, and the reset switch Tr11, the writing switch Tr8 and the initialization switch Tr10 are also formed of an n-type TFT.

In the present embodiment, the drive transistor Tr6, the lighting switch Tr7, the reset switch Tr11, the writing switch Tr8, the light emitting control switch Tr9, and the initialization switch Tr10 in the circuit are formed of an n-type TFT. However, they are not limited thereto. For example, the drive transistor Tr6, the lighting switch Tr7, the reset switch Tr11, the writing switch Tr8, the light emitting control switch Tr9, and the initialization switch Tr10 in the circuit may also be formed of a p-type TFT. The circuit may also be formed of a combination of a p-type TFT and an n-type TFT.

In FIG. 17, a writing control signal SG for the writing switch Tr8, a lighting control signal BG for the lighting switch Tr7, a reset control signal RG for the reset switch Tr11, a light emitting control signal CG for the light emitting control switch Tr9, and an initialization control signal IG for the initialization switch Tr10 are illustrated as various signals.

In the present modification, an operation of sequentially selecting a plurality of the pixel rows from the first line (for example, in FIG. 1, the pixel row located at the uppermost part of the display region AA), writing a potential Vsig (video writing potential) of a video voltage signal VSIG to the pixel 49 of the selected pixel row, and causing the inorganic light emitting element 100 to emit light is repeated for each frame image. During each horizontal scanning period, the drive circuit applies the potential Vsig (video writing potential) of the video voltage signal VSIG to the video signal line 272, and applies a potential Vini (initialization potential) of an initialization voltage signal VINI to the initialization signal line 310.

In detail, the writing operation in the present modification is divided into a reset operation, an offset cancel operation, and a video signal setting operation. The reset operation is an operation of resetting the voltage held in the capacitor 291, the holding capacitor 298, and the additional capacitor 299. The offset cancel operation is an operation of compensating the variation of a threshold value voltage Vth of the drive transistor Tr6. The video signal setting operation is an operation of writing the potential Vsig (video writing potential) of the video voltage signal VSIG into the pixel 49.

The writing operation (reset operation, offset cancel operation, and video signal setting operation) described above and a light emitting operation are sequentially performed for each pixel row. For example, the pixel row is sequentially selected in a cycle of one horizontal scanning period of a video signal. The writing operation and the light emitting operation of each pixel row are repeated in a cycle of one frame.

A light emission possible period for each pixel row is set to a period within a period from the end of the video signal setting operation described above until the start of the writing operation of the pixel row of the next frame image. In the display apparatus 1, the light emission possible period includes a light emitting period and a non-light emitting period. During the light emitting period, the inorganic light emitting element 100 is caused to emit light at an intensity depending on the potential Vsig (video writing potential) of the video voltage signal VSIG written into each pixel 49. During the non-light emitting period, the supply of the drive current to the inorganic light emitting element 100 is forcibly stopped. More specifically, during the light emitting period, the forward current (drive current) is supplied to the inorganic light emitting element 100 from the drive power supply by turning on the light emitting control switch Tr9 while setting the light emitting control signal CG to an H level. During the non-light emitting period, the supply of the forward current (drive current) to the inorganic light emitting element 100 is forcibly stopped by blocking between the drive power supply and the drive transistor Tr6 held in a conductive state by turning off the light emitting control switch Tr9 while setting the light control signal CG to an L level.

The preferred embodiments of the present disclosure have been described above, but the present disclosure is not limited to such embodiments. The contents described in the embodiments are merely examples, and various modifications may be made within the scope of the present disclosure. The embodiments and modifications may be combined with each other, or the modifications may be combined with each other. Appropriate modifications made without departing from the gist of the present disclosure also naturally belong to the technical scope of the present disclosure. At least one of various omissions, substitutions, and changes of the components may be made without departing from the spirit of the embodiments and modifications described above.

What is claimed is:
1. A display apparatus comprising:
a substrate;
a plurality of pixels disposed on the substrate;
a plurality of inorganic light emitting elements that are provided in the pixels, respectively;
an electrode that is translucent and provided on one surface side of the substrate and that is coupled to one of the inorganic light emitting elements;
a first conductive layer that is translucent and provided on the one surface side of the substrate and that covers the electrode; and a cover member that is translucent and provided on the one surface side of the substrate and that covers the first conductive layer, wherein a sheet resistance value of the first conductive layer is higher than a sheet resistance value of the electrode.

2. The display apparatus according to claim 1, wherein the first conductive layer bonds the cover member to the one surface side of the substrate.

3. The display apparatus according to claim 1, further comprising:

a light-shielding second conductive layer that is provided on the one surface side of the substrate and that is coupled to the first conductive layer, wherein the substrate includes
a display region in which the pixels are arranged, and
a peripheral region located outside the display region, and the second conductive layer is arranged in the peripheral region.

4. The display apparatus according to claim 1, further comprising a circularly polarizing plate provided between the substrate and the cover member.

5. The display apparatus according to claim 1, further comprising:

a circularly polarizing plate provided between the substrate and the cover member, and an adhesion layer, wherein the adhesion layer is provided between the substrate and the circularly polarizing plate and bonds the circularly polarizing plate to the one surface side of the substrate, and a sheet resistance value of the adhesion layer is higher than the sheet resistance value of the electrode.

6. The display apparatus according to claim 1, further comprising a third conductive layer provided on another surface side of the substrate that is located on an opposite side from the one surface.

7. The display apparatus according to claim 6, further comprising a light-shielding fourth conductive layer that is arranged on a side surface of the substrate and that is coupled to the third conductive layer.

8. The display apparatus according to claim 1, further comprising a light-shielding conductive layer provided between the electrode and the cover member, an opening located in a region that overlaps with the one of the inorganic light emitting elements in a plan view is provided in the first conductive layer, and a sheet resistance value of the light-shielding conductive layer is higher than the sheet resistance value of the electrode.

9. The display apparatus according to claim 1, further comprising:

a transistor that is provided on the one surface side of the substrate and that is coupled to the one of the inorganic light emitting elements; and wiring provided on the one surface side of the substrate, wherein a first capacitor is formed between the transistor and the one of the inorganic light emitting elements, and a second capacitor is formed between the wiring and the one of the inorganic light emitting elements.

* * * * *